United States Patent [19]

Vinegar et al.

[11] Patent Number: 4,651,099
[45] Date of Patent: Mar. 17, 1987

[54] SCAN ROOM FOR MAGNETIC RESONANCE IMAGER

[75] Inventors: Harold J. Vinegar, Houston; Jefferson H. Taylor, Dallas, both of Tex.

[73] Assignee: NMR Associates, Ltd. 1983-I, Houston, Tex.

[21] Appl. No.: 682,423

[22] Filed: Dec. 17, 1984

[51] Int. Cl.⁴ ............................................. G01R 33/20
[52] U.S. Cl. ..................................... 324/320; 128/653
[58] Field of Search ......................... 324/300, 318–320, 324/316, 307, 322; 128/653

[56] References Cited

U.S. PATENT DOCUMENTS 4,490,675 12/1984 Knuettel et al. ..................... 324/318
4,564,812 1/1986 Van Dijk ............................ 324/318

OTHER PUBLICATIONS

General Electric, "NMR Site Planning Considerations", Copyright 1982, The General Electric Company, pp. 1-12.

Primary Examiner—Michael J. Tokar
Attorney, Agent, or Firm—Vaden, Eickenroht, Thompson & Boulware

[57] ABSTRACT

A scan room is disclosed in which a magnetic resonance (MR) imager can be located that will reduce to an acceptable level outside the room the strength of the fringe magnetic fields produced by the imager and that will shield the imager from magnetic, radio frequency electromagnetic, and electric fields outside the room, while allowing the magnet of the imager to be shimmed to produce a sufficient homogeneous field to obtain the desired images. The scan room is rectangular although it could be cylindrical or spherical. Its walls, floor, and ceiling are made of a plurality of steel plate welded together. The thickness of the walls can vary as the distance from the magnet and the permeability of the steel plates varies. A steel door allows patients and medical personnel to enter and leave the room.

17 Claims, 23 Drawing Figures

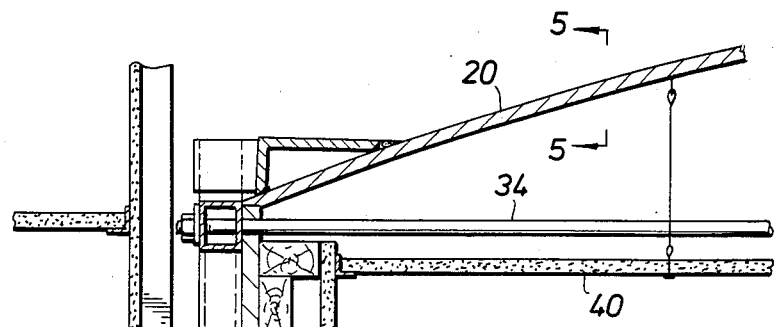
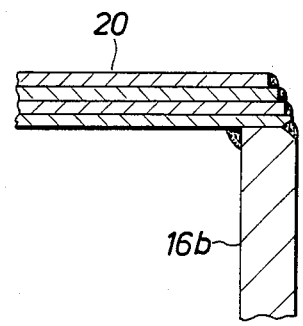
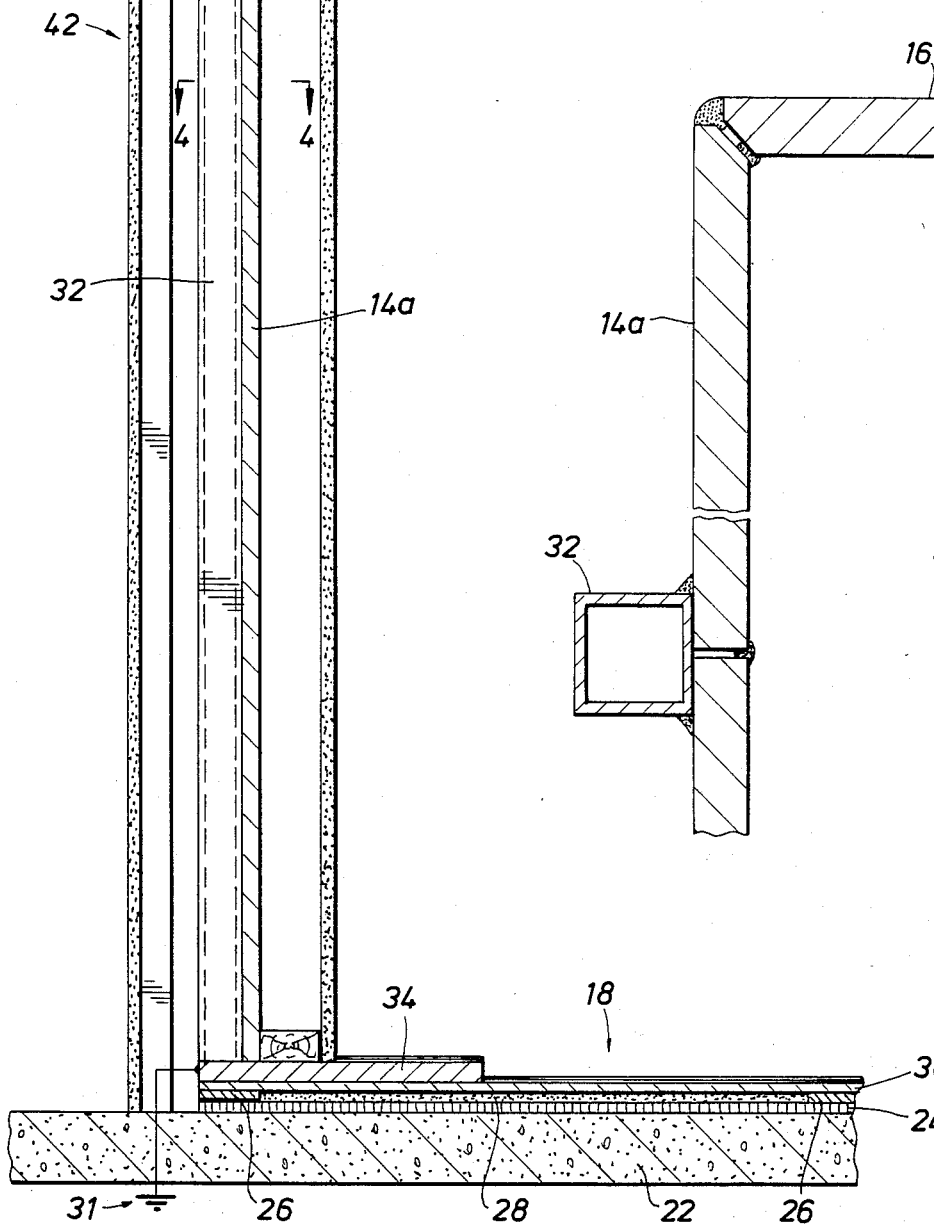

FIG. 18 D.C. PERMEABILITY FOR UNANNEALED STEELS

LOCATION OF VARIABLE WALL STEEL THICKNESSES

SCAN ROOM FOR MAGNETIC RESONANCE IMAGER

This invention relates to magnetic resonance (MR) imagers generally and, in particular, to the scan room in which the imager is located.

MR imagers utilize high magnetic fields and radio frequency electromagnetic radiation to obtain images of the interior of an object. Superconducting magnets are commonly employed in MR for producing magnetic fields greater than 1.5 kilogauss. Because of the fringe fields of such magnets, persons with pacemakers are in danger of being deprogrammed even at considerable distances from the magnet. . Because of this danger, FDA recommendations specify that fringe fields must be maintained below 5 gauss in uncontrolled areas. Aside from persons with pacemakers, fringe fields greater than 2 gauss can seriously distort cathode ray tubes. This renders large areas around, above, and below the MR imager unusable for many business and medical activities.

In addition, successful MR imaging requires that the field inside the MR magnet be stable and homogeneous to a very high degree. Thus the movement of vehicles, elevators, or other large steel objects near the imager can distort the MR image significantly. Consequently, the MR imager must be in an isolated area or it must be shielded from such outside magnetic disturbances. Even non-moving steel objects, such as steel beams and steel reinforcement bars in concrete, can disturb the homogeneity inside the magnet. In order to offset the effects of non-moving steel objects, the superconducting magnet can be shimmed with precisely located steel bars to obtain the necessary homogeneity. It is, however, impossible to shim for moving ferrous objects. MR manufacturers commonly specify that the MR imager be located at least 58 feet from parking lots, elevators, or other locations where there is the potential for large moving ferrous objects.

Magnetic resonance information from the object being scanned consists of signals in the radiofrequency band between 1 and 200 MHz, depending on the strength of the magnet. Any external noise in this radiofrequency band, such as radio stations, electric motors, vehicle ignition systems, etc., reproduce as artifacts in the MR image. Consequently, longer data acquisition times are required to average the noise down to an acceptable level. The best one can do is to reduce ambient radiofrequency noise below the level produced by thermal noise in the object itself and the noise in the RF preamplifier of the imager. The prior art is to surround the MR imager with a shielded room of copper plate or copper screen to obtain the necessary radiofrequency electromagnetic attenuation. MR manufacturers commonly specify a copper shielded enclosure providing at least 80 dB radiofrequency attenuation between 1 and 100 MHz.

Still another problem in MR imaging is capacitive coupling of electrical noise from power lines and ground currents. The prior art solution is to create a Faraday shield of copper plate or copper screen that is electrically isolated or "floated" from the ground. MR manufacturers commonly specify that electrical power line noise be attenuated by at least 100 dB at the MR imager operating frequen- cy.

Therefore, the problem is to shield the environment outside of the scan room from fringe magnetic fields of the magnet, and to shield the imager from external d.c. and time-varying magnetic fields, as well as from radio-frequency electromagnetic radiation and electrical power line noise. This shielding must be accomplished without impairing the homogeneity of the magnetic field inside the magnet of the imager.

PRIOR ART

The prior art failed to take into collective account all four MR shielding problems (magnetic fringe containment, shielding from d.c. and time-varying external magnetic fields, shielding from radiofrequency electromagnetic radiation, and shielding from electrical power line noise). For example, copper is the preferred material for radiofrequency shielding, but it has no capability for confining magnetic fields.

It is well known in the art that ferrous metals can also be used for electromagnetic shielding. (See Electronics Dictionary, 4th Edition, copyright 1978 by McGraw-Hill, Inc.). In the case of MR imaging, however, it was thought that a mass of ferromagnetic shielding near the magnet would have a deleterious effect on the homogeneity of the magnetic field inside the magnet. For example, the site planning guide for MR imaging systems manufactured by Diasonics, NMR Division, 533 Cabot Road, South San Francisco, CA 94080, states that the construction materials of the scan room must be non-ferrous. Moreover, it was not appreciated in the prior art that a complete ferromagnetically-shielded room could also be used to confine the fringe magnetic field produced by the MR magnet.

SUMMARY OF THE INVENTION

Contrary to the teachings of the prior art, and in accordance with this invention, it has been discovered that a scan room of substantially solid steel, which is symmetrically placed with respect to the magnet, will contain the five gauss line of the magnetic field within the scan room, provide the required magnetic, RF electromagnetic, and electric shielding, shield the imager against large moving ferrous objects, and yet provide a magnetic field homogeneity inside the magnet to the extent that it can be readily shimmed for producing proper images. The site dedicated to imaging can then be placed in hospitals and other populated areas, and space can be more economically obtained in desirable locations. It is an object of this invention to provide such a room.

More specifically, an object and feature of this invention is to provide a scan room that will shield the imager from RF radiation of from 1 MHz to 100 MHz generated outside the scan room by attenuating these electromagnetic fields by 120 dB or more. This will enable one to obtain superior MR images in shorter data acquisition times.

It is a further object of this invention to provide a solid steel scan room for an MR imager that allows the shape of the room and the thickness of the steel in the walls to vary as required to match the shape and strength of the fringe magnetic field thereby reducing the cost of the MR imaging site and the cost of materials and labor for the site.

It is a further object of this invention to provide a steel scan room for an MR imager that is made primarily of relatively low cost steels that attenuate the fringe field intensity to the range where relatively high-cost steels with high magnetic permeability can be employed with economic advantage. A further advantage of this invention is to show how the high magnetic permeability steels can be used only at selected areas to keep material and labor costs to a minimum.

It is a further object and feature of this invention to provide a scan room that will attenuate electrical power line noise by at least 100 dB at the MR operating frequency.

It is another object and feature of this invention to provide such a scan room that has adequate openings to provide ingress and egress to the scan room while maintaining the ability of the scan room to meet the specifications required for attenuating the magnetic, RF electromagnetic, and electrical fields generated both within and without the scan room.

These and other objects, advantages, and features of this invention will be apparent to those skilled in the art from a consideration the specification including the attached drawings and appended claims.

IN THE DRAWINGS

FIG. 3 is a vertical section through one side of the scan room of FIG. 1 showing the construction of the ceiling, side walls, and floor or base of the scan room.

FIG. 4 is a sectional view on an enlarged scale taken along line 4—4 of FIG. 3.

FIG. 5 is a sectional view on an enlarged scale taken along line 5—5 of FIG. 3 showing the connection between the end of the curved ceiling and the end wall of the room.

Figure 13:
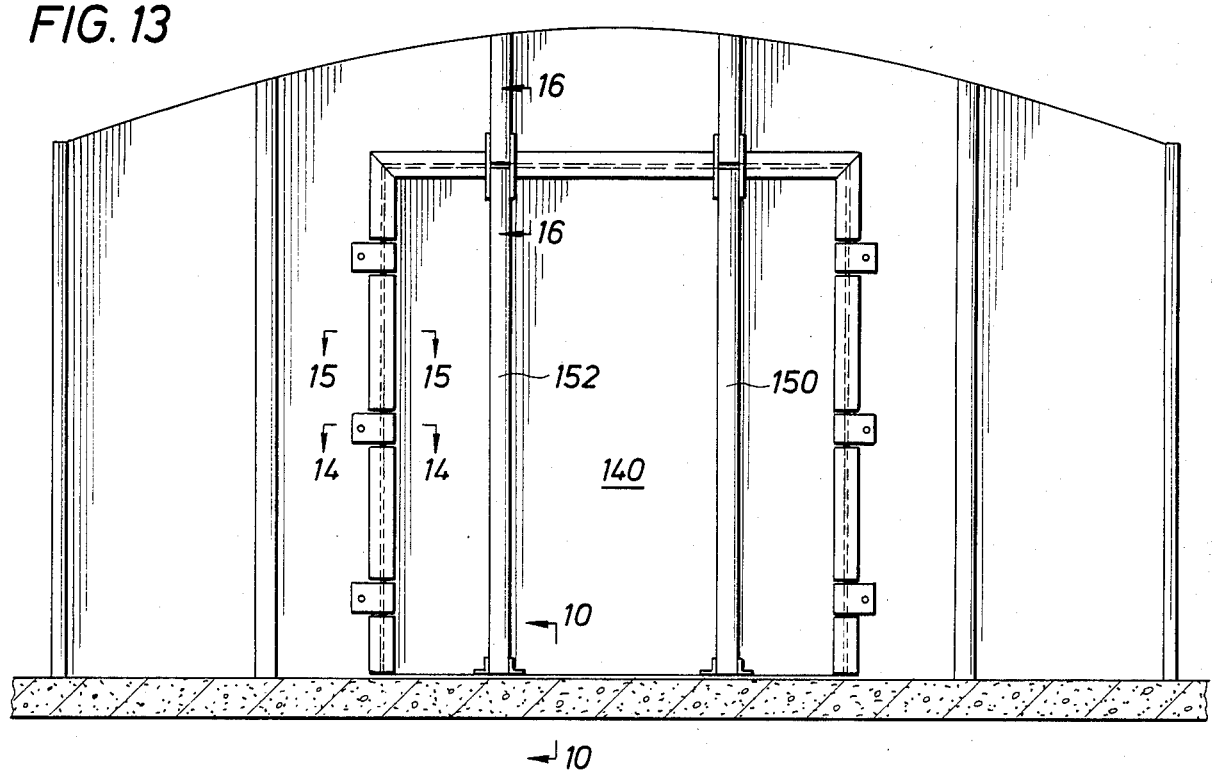
FIG. 13 is a view in elevation of the rear of the scan room.
Figure 14:
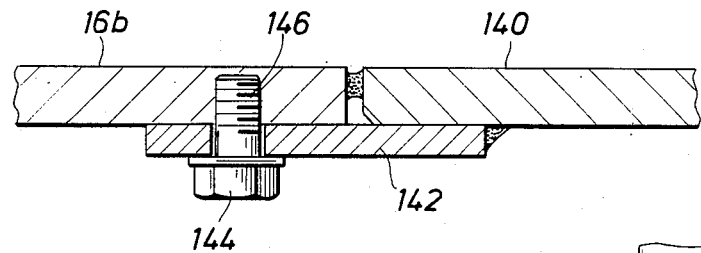
Figure 15:
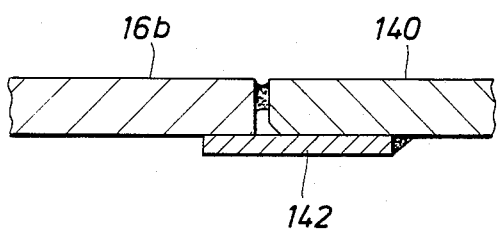
Figure 16:
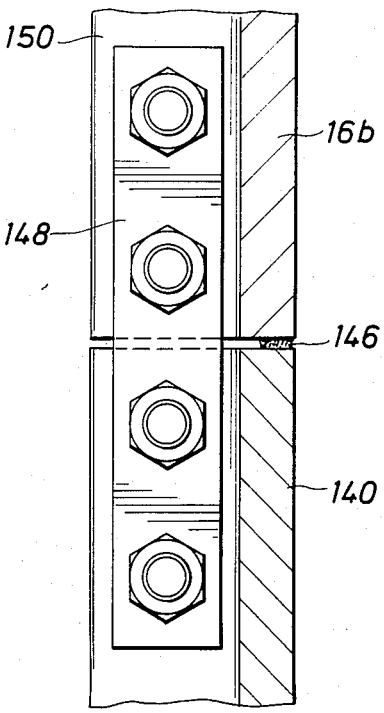

FIGS. 14, 15, and 16 are sectional views taken along lines 14—14, 15—15, 16—16 of FIG. 13.

Figure 17:
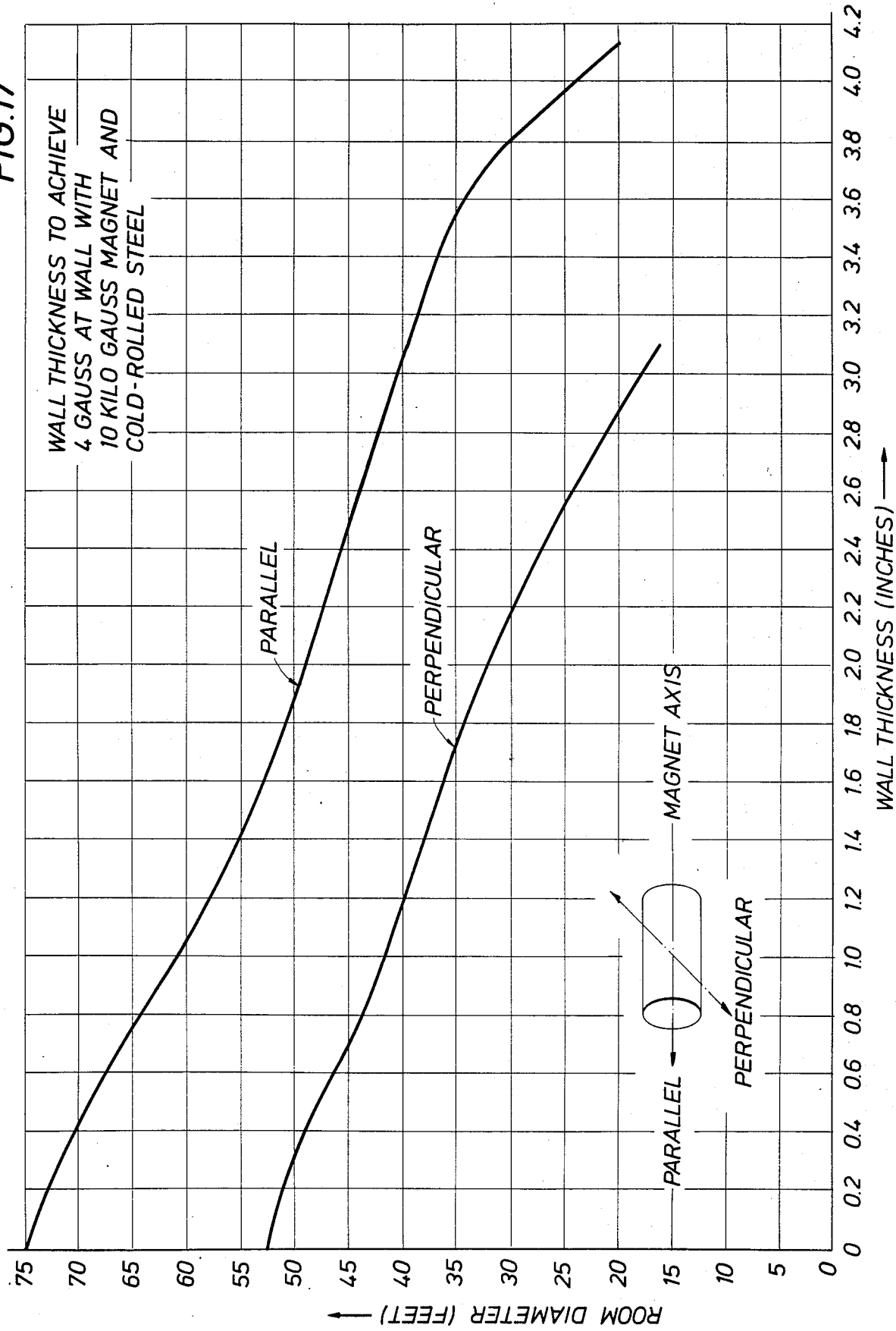

FIG. 17 is a graph showing the wall thickness required to reduce the fringe magnetic field to 4 gauss at the outside of the walls of the scan room with a 10 kilogauss magnet using cold-rolled steel for the walls of the scan room.

Figure 18:
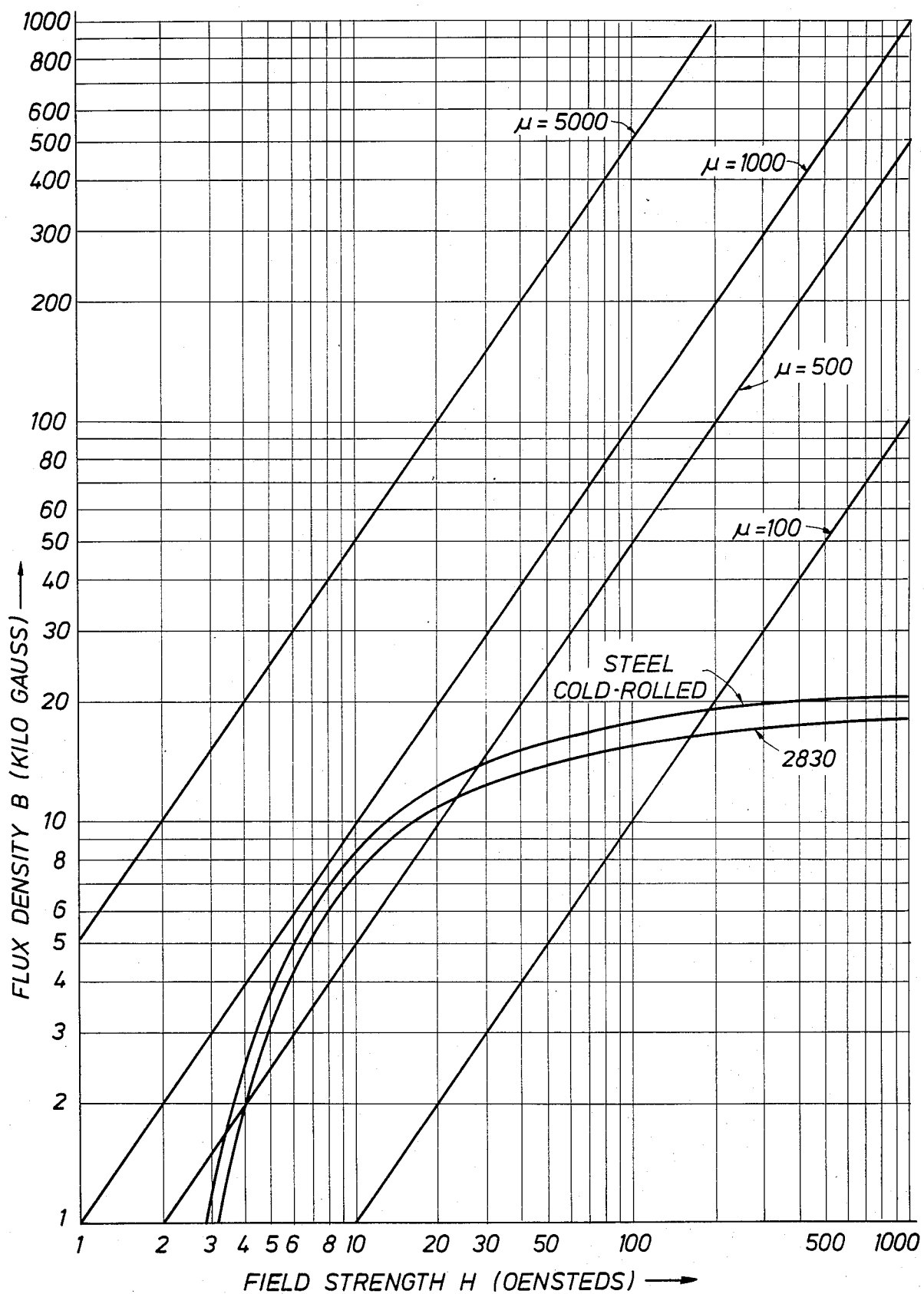

FIG. 18 is a graph showing DC permeability for un-annealed steels.

Figure 19:
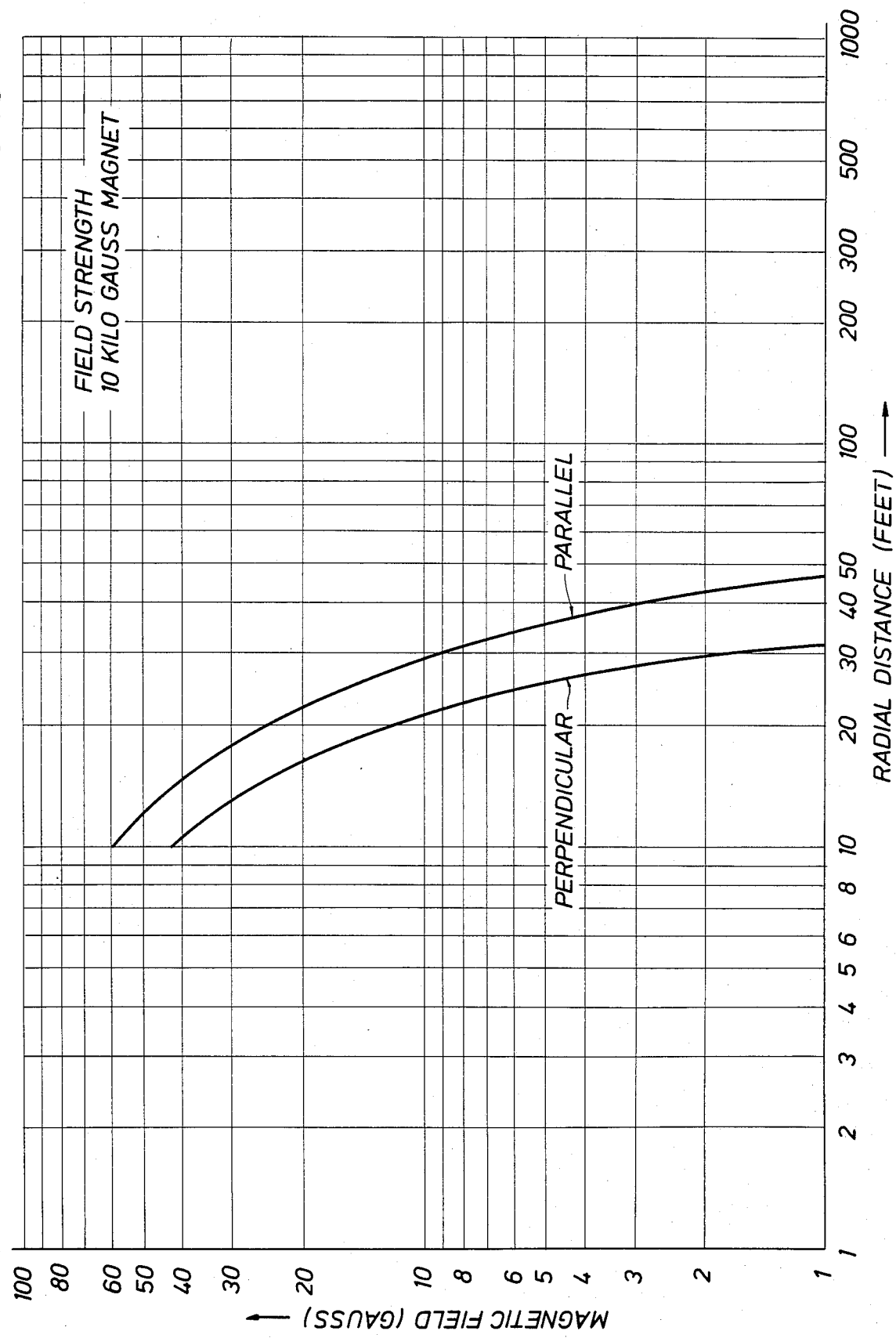

FIG. 19 is a graph of the field strength versus distance for a 10 kilogauss superconducting magnet.

Figure 20:
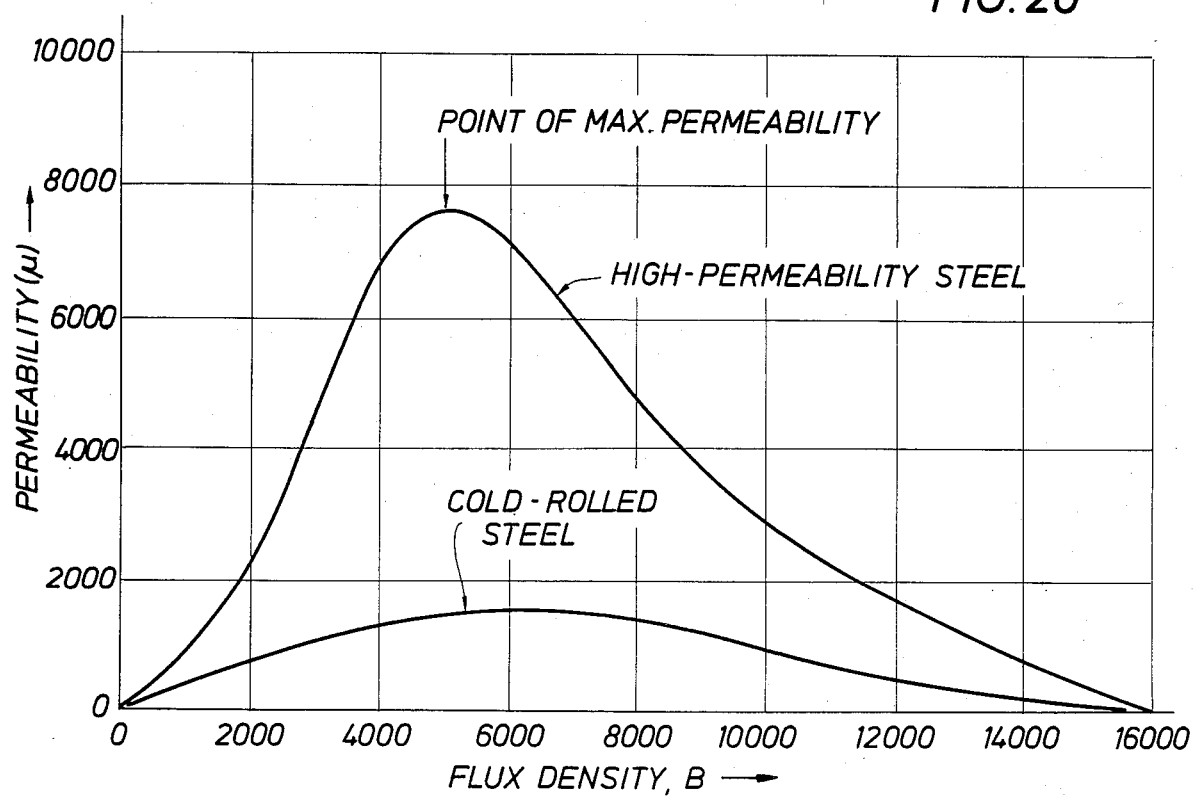

FIG. 20 is a graph comparing the permeability of a highly permeable steel with that of cold-rolled steel.

Figure 21:
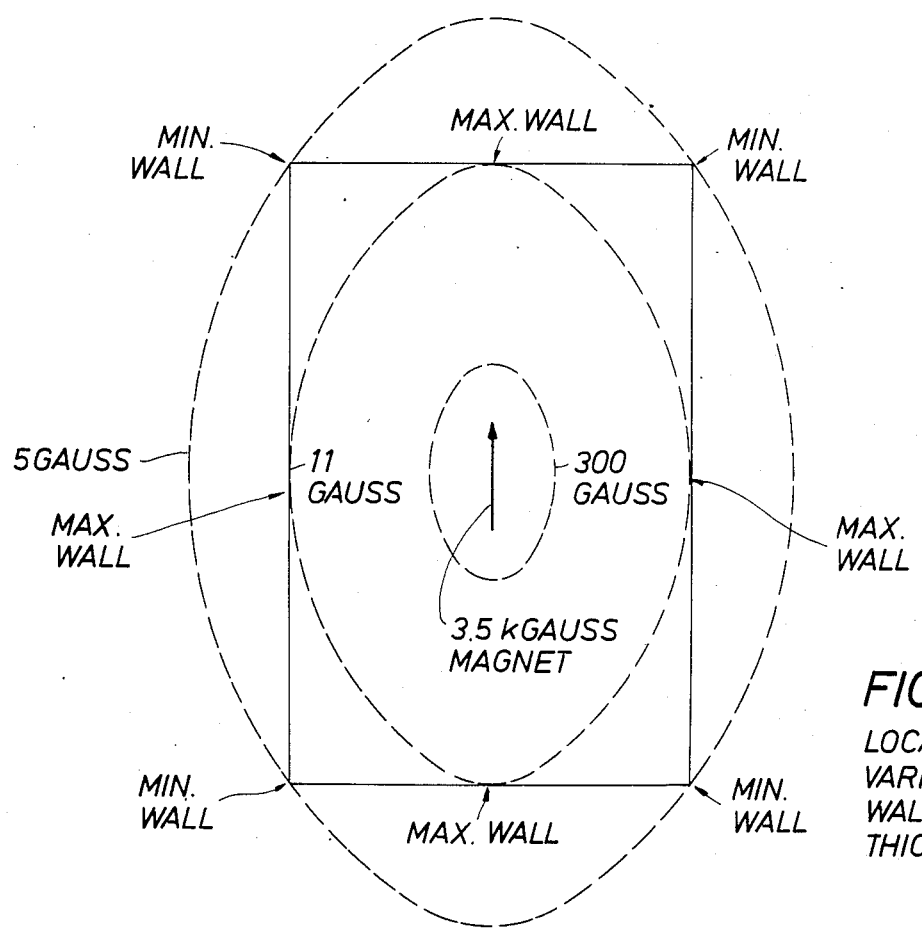

FIG. 21 shows the fringe field strength for 3.5 kilogauss magnet located inside a rectangular scan room to show how the wall thickness of the scan room can be reduced in certain areas and to show how the walls can be varied in thickness while maintaining the five gauss line inside the walls of the scan room.

Figure 22:
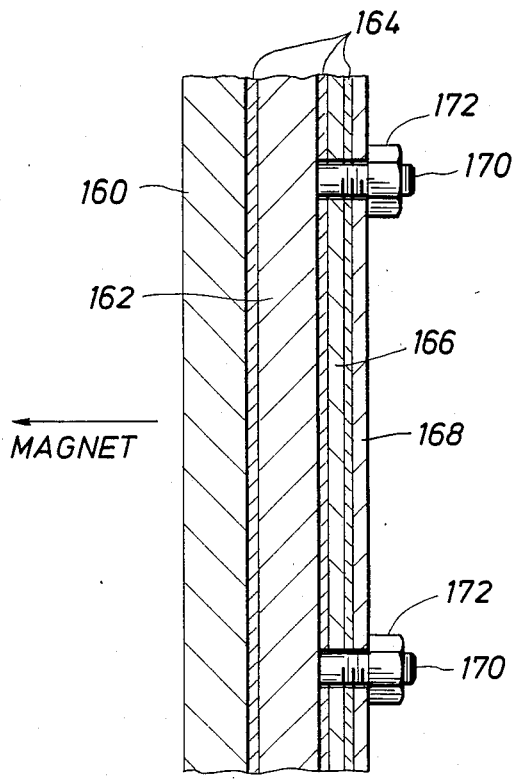

FIG. 22 is a cross-sectional view through a portion of the wall of the scan room designed to allow plates of high permeability to be added or removed as required to selectively increase and decrease the wall thickness and its ability to contain the fringe magnetic field of the magnet.

Figure 23:
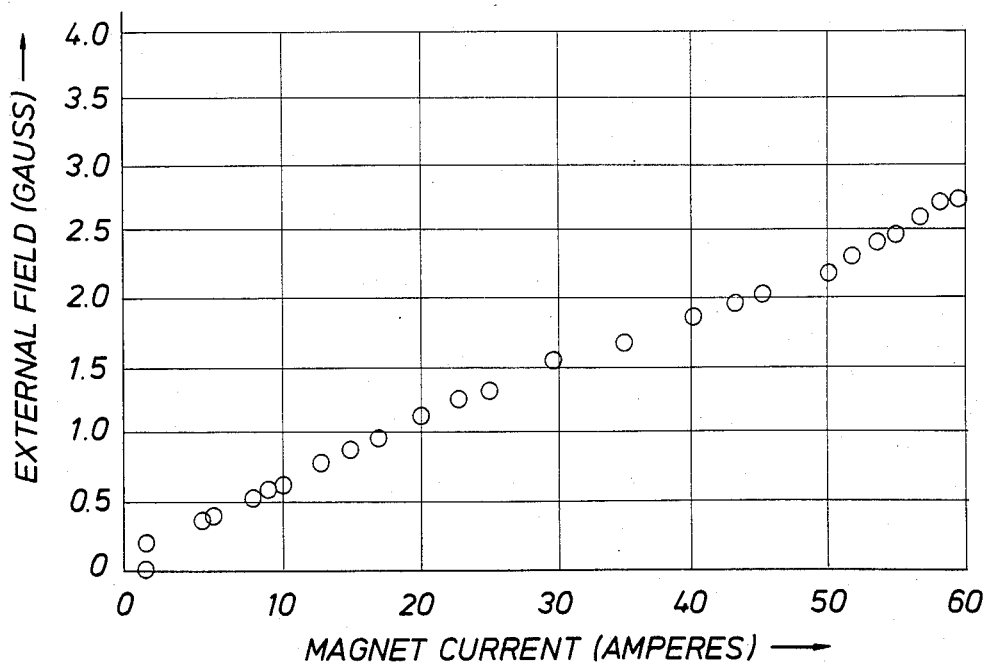

FIG. 23 is a curve of the actual measurements of the magnetic field outside a scan room constructed in accordance with this invention as the magnet current increases to the operating current of 60 amperes for a 3.5 kilogauss magnet.

In general, for a spherical shell of wall thickness $\Delta$ and radius $\gamma$, constructed of material with permeability $\mu$, the attenuation factor $\rho$ is approximately $$\rho \simeq 1 + \frac{\mu \Delta}{\gamma}$$

Thus as the permeability of the material and/or the wall thickness increases the attenuation factor increases.

As shown in FIG. 21, the fringe magnetic fields of the magnet of an MR imager are generally ellipsoid in shape and extend out further from the poles of the magnet then from the sides. The ideal room shape would thus be an ellipsoid that matched the field contours. The thickness of the walls required to attenuate the fringe magnetic fields vary with the distance the walls are from the magnet. Another factor is whether the walls are facing the parallel fields, which are those parallel to a line extending through the poles of the magnet, or whether they are facing fields that are perpendicular to the magnetic axis, as shown in FIG. 17. Obviously, from the shape of the fringe fields, as shown in FIG. 21, a scan room that is cylindrical in cross-section and positioned with its longitudinal axis parallel to the magnetic axis would be a desirable shape for the scan room. Such a room could be constructed from a cylindrical steel tank or large steel duct.

In most cases, however, the most practical shape for a scan room will be one that is rectangular in cross-section, such as the scan room shown in FIGS. 1 through 16. Such a room has what is conventionally called side walls, end walls, a ceiling, and a floor. A scan room that is cylindrical in shape would have just a side and end walls. So it is intended in this specification that "wall" is a generic term that includes ceilings and floors as well as end walls and side walls.

Figure 1:
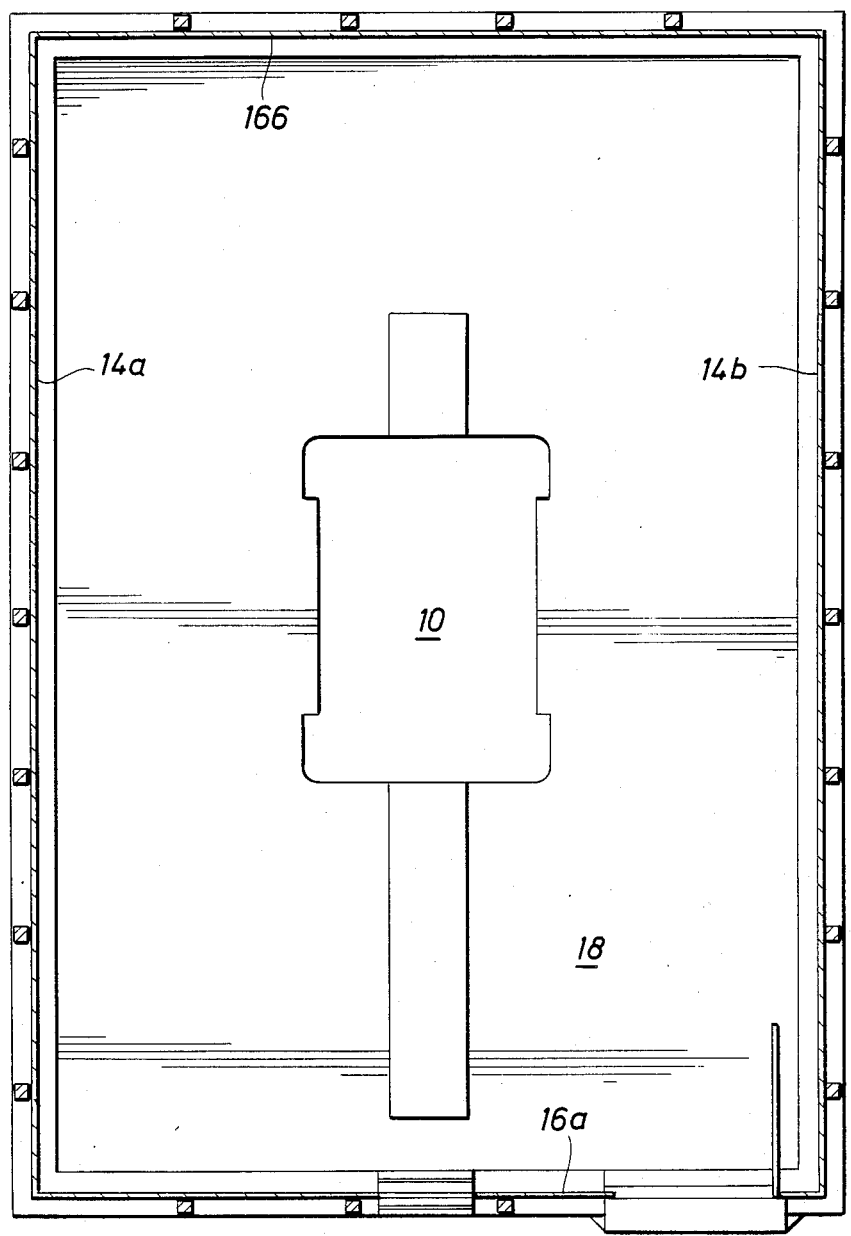
FIG. 1 is a sectional view of a rectangular scan room constructed in accordance with this invention taken along line 1—1 of FIG. 2.
Figure 2:
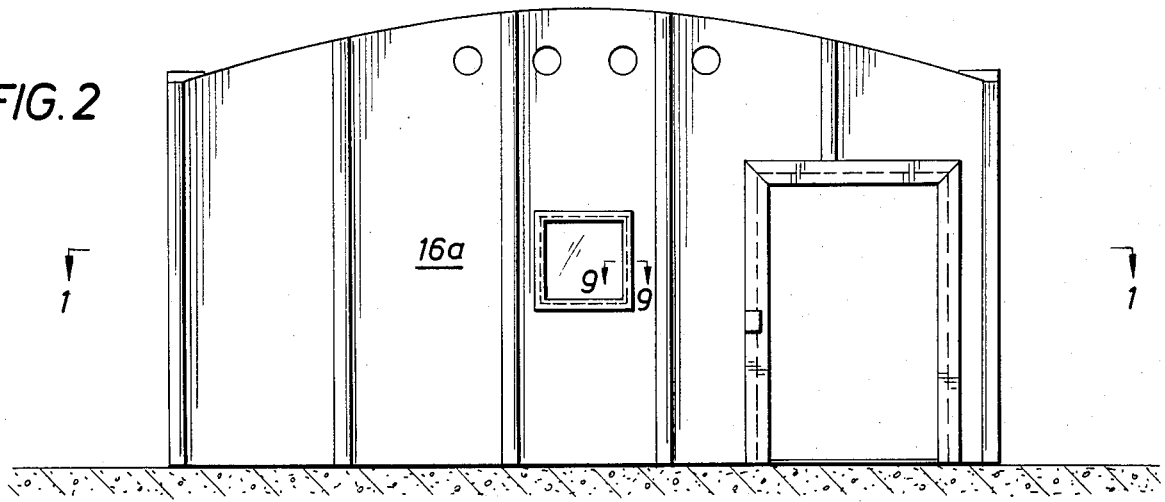
FIG. 2 is a front view of the scan room of FIG. 1 looking in the direction of the arrows 2—2.

As shown in FIG. 1, MR imager 10 is positioned in the geometric center of the scan room. Platform 12 supports the patient in the proper position to obtain the desired image or images. The MR imager is surrounded completely on all sides by solid steel walls made up of abutting steel plates that are connected electrically together to provide no opening through which magnetic fringe fields or RF radiation can escape or enter the room. In the preferred embodiment, the abutting plates are connected by weld metal that provides a good electrical connection between the plates and structural integrity. The breaks in this solid steel enclosure are limited, preferably to the openings through which utilities, such as air-conditioning, electrical conduits, waterlines or the like extend into the room, the door that must be provided to allow people to enter and leave the room, and, preferably, a window to allow the people outside to look in and the people inside to look out. The construction of the door, window, and other openings in the otherwise solid steel room that provide these functions while insuring that no fringe magnetic field or RF radiation escapes or enters the room will be described in detail below.

Generally, the scan room has side walls 14a and 14b, flat front and back walls, 16a and 16b, floor 18, and arcuate roof or ceiling 20 that curves upwardly away from the imager in a direction perpendicular to the magnetic axis of the MR imager. As shown in FIG. 3, floor 18 rests on concrete slab 22. This will generally be the case because the steel room and the imager are both heavy. Above the concrete base is layer 24 of asbestos board a material that has a high electrical resistance. On top of the transite base at spaced intervals are strips 26 of steel plate, preferably made of stainless steel. The space between the strips of stainless steel is filled with floor stone 28, which is covered by steel plate 30. This layer of steel is made up of a plurality of plates welded together since steel plate is usually supplied in strips 48" wide. The steel floor is then covered by vinyl sheet tile or some other suitable flooring. Preferably, although it is not shown in the drawings, a sheet of water impervious material that also has a high electrical resistance, such as polyethylene is placed between the slab and the asbestos board layer to provide a moisture barrier between the slab and the floor of the room. The combination of the relatively thin sheet of polyethylene and the relatively thick layer of asbestos board that increases the space between the metal in the floor and the ground results in a resistance to ground in excess of 50,000 ohms. The room is then grounded at only one point, 31, to prevent ground loop noise. "Ground", as used herein, means a conducting path between the room and the earth.

The side and end walls are generally of the same construction. In FIG. 3, side wall 14a is made up of a solid wall of steel. If the thickness of the wall is going to be say ¼" or ½", then steel plate of that thickness can be used. Here again, the wall will be made up of a plurality of plates welded together. But if the thickness is going to be greater than that, then preferably the wall will be made up of a plurality of overlapped plates. For example, in the scan room that has been constructed, the wall thickness was specified to be one inch thick. For convenience and ease in construction, the walls were made up of four layers of steel plate ¼" thick. In such an arrangement, the welded joints between adjacent plates should be staggered so that the chance of RF radiation or magnetic fields escaping from or entering into the room through the welds is reduced. In the drawing, the wall is shown solid for convenience.

The solid steel end and side walls are supported by a plurality of spaced hollow steel columns that are rectangular in cross-section. These columns are designated by the number 32. A relatively narrow foot plate 34 is welded to floor plate 30 to support columns 32 and side wall 14a. The side wall also should be welded to foot plate 34 to provide a sealed joint between the bottom of the wall and the floor of the room.

Figure 6:
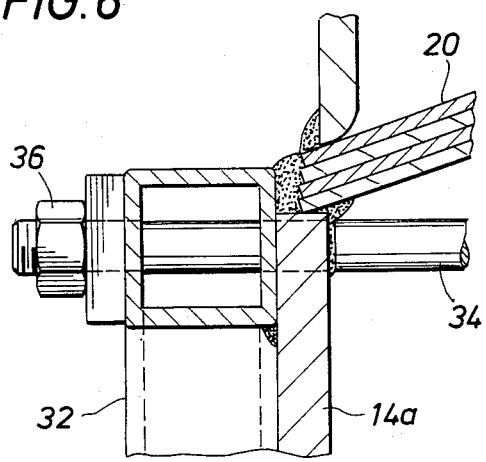
FIGS. 6 and 7 are vertical sectional views of alternate connections between the edge of the curved ceiling and the top of the side walls.

Extending between the top of the side walls in the direction that ceiling 20 curves are a plurality of tie rods 34. These tie rods extend through the walls adjacent their upper ends, through one of the rectangular columns, and are secured in place by nuts 36 as shown in FIG. 6. For aesthetic purposes, inner wall 38 made out of sheet rock or some such material is positioned to cover the walls and provide a more pleasing aspect to the room. In the same manner, an acoustic tiled ceiling 40 can be suspended from steel ceiling 20 as shown in FIG. 3. The acoustic tile reduces noise reverberation in the room produced by switching the gradient fields in the MR imager. Also, sheet rock wall 42 can be located outside the room to cover the steel construction of the room so that the casual observer would have no idea that he was entering or leaving a solid steel room.

FIG. 4 shows the details of construction of the connections between the end walls and the side walls. In the Figure, it is the connection between side wall 14a and end wall 16b. The walls are shown as solid steel although, as explained above, they more likely will be made up a number of overlapping plates. The edges are beveled as shown and welded on the inside and outside.

Figure 7:
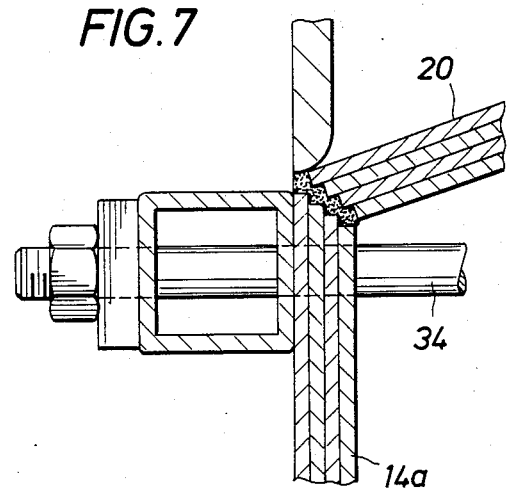

FIG. 5 shows the detail of the connection between ceiling 20 and one of the end walls such as end wall 16b. The ceiling is shown as being made up of a plurality of overlapping plates and end wall is shown as a solid plate. Here again they both could be made up of overlapping plates. Alternate connections between the edges of arcuate ceiling 20 and side wall 14a are shown in FIGS. 6 and 7. In FIG. 6, the ceiling is made up of a plurality of plates and the side wall is a solid plate. The weld pattern shown in FIG. 6 is preferred to ensure a seal between the plates that will prevent the ingress of RF radiation. In FIG. 7, with the side wall and ceiling both being made up of overlapping plates, each layer of plates will be welded to the corresponding layer in the ceiling as the room is assembled.

Figure 8:
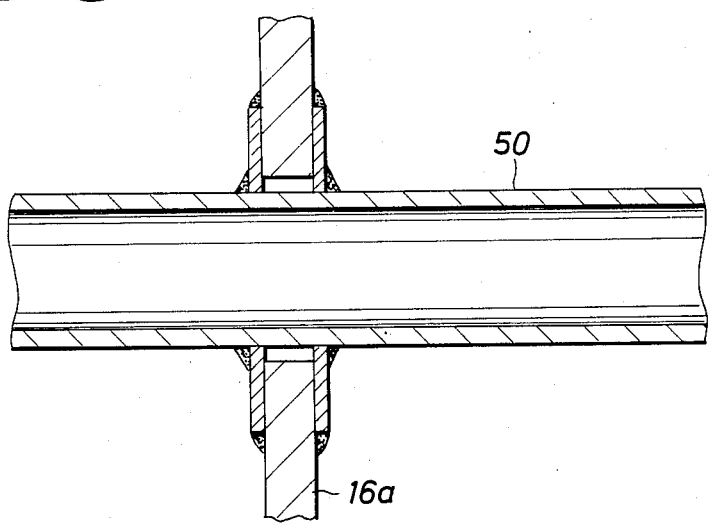
FIG. 8 is a sectional view through a wave guide extending through a side wall of the scan room through which utilities, air-conditioning and the like can pass into and out of the room.

FIG. 8 shows the detail of a wave guide extending through front wall 16a through which air can be pumped into and out of the room. In order to prevent escape of RF radiation, tubular member 50 must be made of an electrically conductive material and shaped to provide the proper attenuation to such RF radiation as is produced by the imager or that is likely to be on the outside of the room. To insure the proper protection, here again from both the inside and outside radiation, the wave guide should be designed to achieve an attenuation of at least 80 dB at a frequency of 1 MHz.

Figure 9:
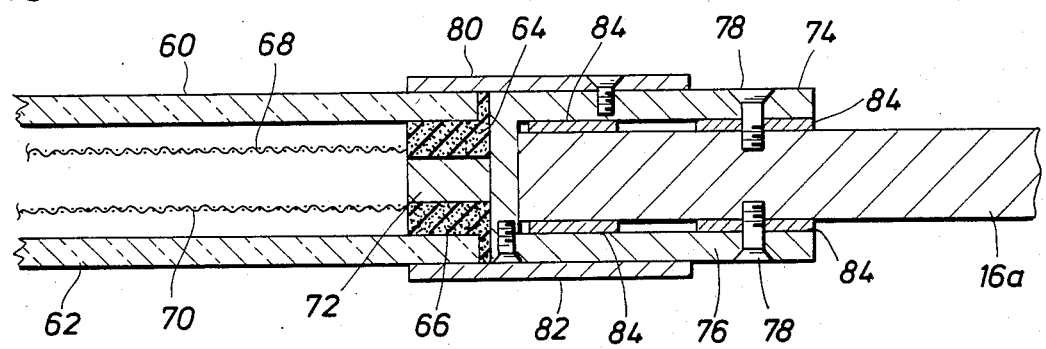
FIG. 9 is a sectional view through a window in the front wall of the scan room through which activities in the scan room can be observed from outside.

A window is provided in the otherwise solid steel room so that people inside won't feel so isolated and people outside can look in to see what's going on. The window must be able to attenuate the RF fields in the same manner that the steel walls do. Such a window is shown in FIG. 9. The window is located along the axis of the magnet so the patient is visible to the operator located outside. It includes two-spaced glass panes 60 and 62 mounted in foam rubber pads 64 and 66. Located between the panes are two parallel copper screens 68 and 70 that attenuate the electromagnetic energy passing through the glass panes. These screens are soldered at each along their edges top and bottom and sides to brass spacer 72. The spacer in turn is soldered to a U-shaped member made up of angle 74 and plate 76, both of which are made of brass. The U-shaped member is attached to front wall 16a by mounting screws 78. Brass face plates 80 and 82 are attached to the U-shaped member and extend partially over glass panes 60 and 62. Strips 84 of tin copper braid are positioned between the U-shaped member and front wall 16a to prevent leakage of any RF signals into and out of the room. The window must be relatively small so that magnetic fringe fields do not extend out significantly from the window.

Figure 11:
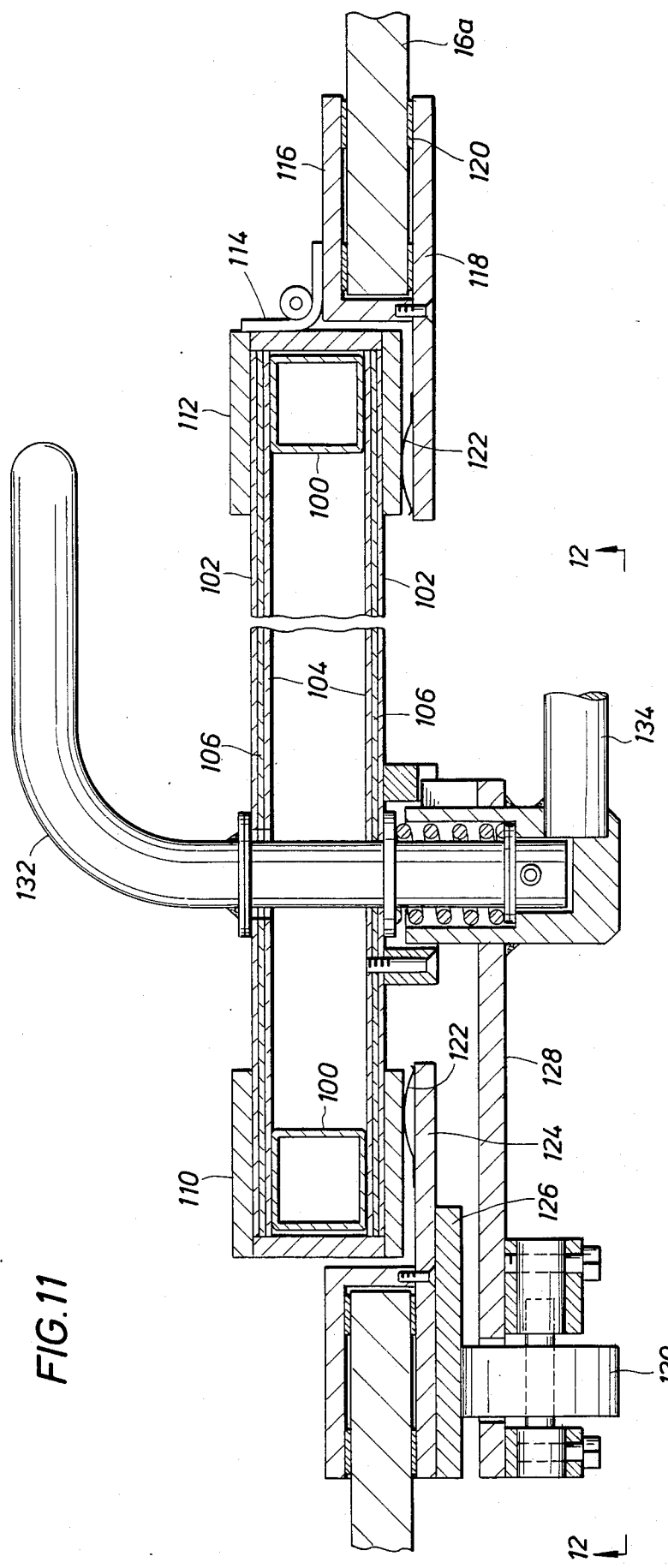
FIG. 11 is a horizontal section of the door provided in the front wall of the scan room and the latch that holds the door shut.
Figure 12:
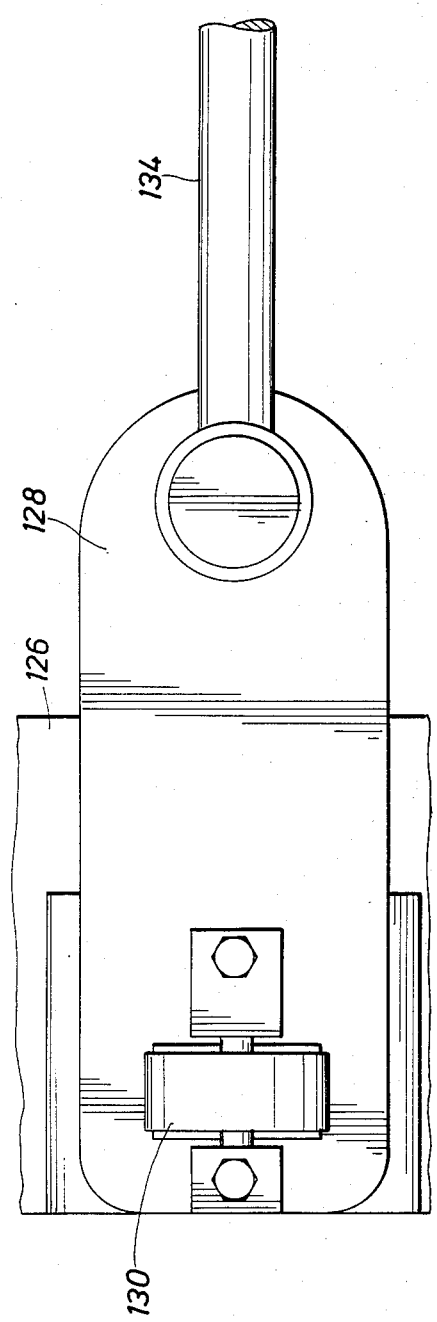
FIG. 12 is a view looking in the direction of arrows 12—12 of FIG. 11.

The details for the door of the scan room are shown in FIGS. 11 and 12. The door includes a rectangular frame made up of tubular steel members 100 that are rectangular in cross-section. Covering the frame on both sides is outer layer 102 of stainless steel, inner layer 104 of cold-rolled steel, and middle layer 106 of copper. The door for a 3.5 kilogauss MR imager was made up of 44 ounce copper which is 1/16" thick as the inner layer. The stainless steel layer was 1/16" thick stainless and the inner steel layer was 16 gauge cold-rolled steel that could be spot-welded to the metal frame. The edges of the door are covered by U-shaped members 110 and 112 made of brass. The door is mounted for pivotal movement into the room by hinges 114 that are attached to L-shaped brass members 116. On the outside, L-shaped members 116 are connected to brass face plates 118 and the joint between these two members and front wall 16a are sealed by the tin copper braid used with the window. Face plate 118 extends into the opening for the door and supports beryllium copper finger springs 122 that engage the door as shown in FIG. 11 to prevent RF frequencies and magnetic fields from entering or leaving the room. In the same manner, on the opposite side of the door frame, plate 124 supports beryllium copper finger springs 122. Strike plate 126 is attached to plate 124 and is engaged by latch arm 128 when the door is closed as shown in FIG. 11. Latch arm 128 includes roller bearing 120 mounted adjacent its end that actually engages strike plate 126. The roller bearing reduces the friction between the latch arm and strike plate thereby allowing the latch arm to be rotated into and out of engagement with the strike plate with a minimum torque. Handles 132 and 134 are located on the inside and outside of the room, respectively, to allow the door to be opened and closed from both sides.

The scan room is built without the MR imager in place inside. Therefore provision must be made for moving the imager into position in the room after the room has been built. The door normally used for people to move into and out of the room is not large enough for this purpose. Therefore, provision is made for providing an opening in the rear wall of the room large enough to allow the equipment to be moved in and out, but which is not normally open and is more or less semi-permanently in place most of the time. Such a temporary door is shown in FIGS. 13 through 16. It consists of solid steel panel 140 that is tack-welded in place in an opening provided in rear wall 16b. Tack welds are used to provide at least some resistance to the passage of magnetic and RF fields between the ends of the plates but which can be easily cut when it comes times to open the back of the room.

Figure 10:
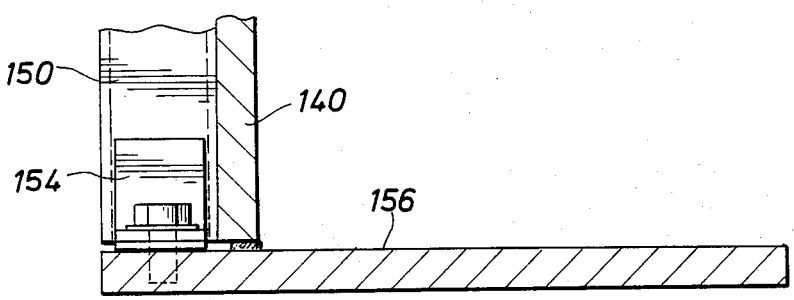
FIG. 10 is a sectional view taken along line 10—10 of FIG. 13.

To provide the necessary seal to prevent leakage into and out of the room, metal strips 142 of metal plate extend around and overlap the joint between the panel 140 and back wall 16b. These plates are welded at one end to the panel as shown in FIG. 14 and have an opening through which bolts 144 can engage tapped holes 146 provided in the back wall. The top of panel 140 is secured to wall 16b as shown in FIG. 16 by weld 146 and also by metal strap 148 that is bolted to columns 150 and 152 overlapping where these columns have been cut so that these columns can continue to support the end wall even though they are cut. The bottom end of panel 140 is welded to the floor as shown in FIG. 10 and is further connected to columns 150 and 152 by angle 154 that is bolted to base 156. To remove the panel, the bolts are removed and the welds cut between the panel and the back wall.

As stated above, a scan room was built in accordance with this invention to house a 3.5 kilogauss MR imager. It is located at 8968 Kirby Drive in Houston, Tx. Calculations prior to the construction of the room suggested that it should be 30 feet long, 20 feet wide, the side walls should be 9 feet high, and the ceiling should have a radius of curvature of 26'7⅜" measured from the inside surface of the ceiling. The side and end walls and the ceiling were made of four overlapping layers of cold-rolled steel plate ¼" thick to provide a total thickness of one inch of cold-rolled steel. The floor underneath the imager as stated above was constructed of solid steel plate ¼" using A36 steel. The floor did not require the same thickness of metal that the walls and ceiling did because it is closer to the magnet center than the ceiling. To symmetrize the field, the floor under the magnet was non-magnetic stainless steel. Copper sheet could also have been used. After the room was constructed and the imager installed, measurements of the magnetic field strength were made at the outside walls and, in all cases, the magnetic field outside the room was below 5 gauss. FIG. 23 is a plat of the actual measurements of magnetic field taken outside the west wall of the room about shoulder high as the current supplied to the magnet increased to 60 amperes. The Kirby site is located within 25 feet of a parking lot and no disturbance has been observed even when liquid helium is being delivered by a truck. By using the curved ceiling, the distance between the ceiling and imager directly over the imager is increased where the magnetic field would be the strongest. This allows the thickness of the ceiling to be reduced because of the increased distance between the ceiling and the imager.

FIG. 17 shows how the wall thickness required to achieve 4 gauss at the wall with a 10 kilogauss magnet using cold-rolled steel varies with the distance that the wall is from the magnet. For example, for a wall thickness of 1.2" the side walls that are facing the perpendicular component of the magnetic axis would be required to be forty feet from the magnet. The end walls would be approximately fifty-seven feet. For a two inch wall thickness, the side walls can move into thirty feet and the end walls to approximately 47½ feet. This is a very large room and lots of steel. Cold-rolled steel, of course, is much cheaper than steels having a high permeability. As shown in FIG. 20, there is a substantial difference between the permeability of this steel and cold-rolled steel when the flux density in the steel is between 4,000 and 8,000 gauss. But the difference drops off rapidly as the flux density increases leaving little advantage between the high permeability and very expensive steels and the cold-rolled steels. Therefore, enough cold-rolled steel should be used to reduce the flux density to where the maximum benefit is obtained from the high permeability steel.

By using a careful mixture of the two different steels, however, a substantial savings can be realized in total weight of the room and its cost. For example, referring to FIG. 21 again, if the walls of the room are made of a cold-rolled steel just thick enough to provide the minimum wall required to confine the magnetic field at the locations furthest from the magnet and then, at the areas where this minimum wall thickness would not be sufficient, adding a layer of high permeability steel to provide the necessary attenuation at these points, a reduction of the total weight of the room would result and provide a substantial savings in construction cost.

An example of how this can be done is shown in FIG. 22, here two layers 160 and 162 are welded together in overlapping position with a small spacer between the two metal plates. Spacer 164 can be any non-permeable material, such as air, wood, chips and wallboard. The combined thickness of the two plates 160 and 162 are designed to provide the minimum wall required to maintain the magnetic field. Then in the areas where this wall thickness is not adequate, additional plates 166 and 168 of steel having a high permeability can be bolted in place at selected locations to provide the necessary attenuation factor to that portion of the room. As shown in FIG. 22, these plates can be attached by studs 170 that are attached to the outside surface of plate 142 and extend through holes in plates 166 and 168. The plates are held in place by nuts 152.

As shown in FIG. 21 an ellipsoid magnetic fringe field located inside a rectangular room causes the wall thickness requirement to vary because of the changing distance between various portions of the wall and the magnet. As shown in the Figure, the center of the side walls should be thicker than the walls adjacent the corners.

Field contours are computed as if no shielding were present and after the particular shape of the room is superimposed on the field contour, the field intensity at the walls of the room are determined. The thickness of the steel at each location can be then scaled according to the field strength at that location using the B versus H (flux density versus magnetic induction) curves for the steel or steel composite. Such a curve is shown in FIG. 18 relating to cold-rolled steel and a steel manufactured by U.S. Steel called 283C.

Then, as stated above, the room can be built with a minimum wall thickness and then the wall thickness augmented wherever required and only where required by adding additional steel plates in the manner shown in FIG. 22. In addition, should the magnet be changed to one producing a stronger field, the room can be adapted to it by adding additional plates.

Any particular scan room should be designed to provide only the protection desired. For example, the room in Houston was on the ground floor of a multi-story building. There was no need to protect anything in the ground below the foundation so only the steel required for symmetry was used. If the scan room is in a one-story building, it may be necessary to make only the side walls of steel.

From the foregoing it will be seen that this invention is one well adapted to attain all of the ends and objects hereinabove set forth, together with other advantages which are obvious and which are inherent to the apparatus and structure.

It will be understood that certain features and subcombinations are of utility and may be employed without reference to other features and subcombinations. This is contemplated by and is within the scope of the claims.

Because many possible embodiments may be made of the invention without departing from the scope thereof, it is to be understood that all matter herein set forth or shown in the accompanying drawings is to be interpreted as illustrative and not in a limiting sense.

What is claimed is:

1. A scan room in which a magnetic resonance (MR) imager can be located that will reduce to an acceptable level outside the room the strength of the fringe magnetic fields produced by the imager and that will shield the imager from magnetic, radio frequency, and electric fields external to the room while allowing the magnet of the imager to be shimmed to produce a sufficiently homogeneous field to obtain the desired images; said scan room comprising a plurality of plates of ferromagnetic material electrically connected and enclosing the MR device, said plates being spaced from the device and symmetrically located to balance the fringe magnetic field, an opening in the plates providing ingress and egress to the scan room and the imager, means for electrically insulating the room from earth ground, means connecting the room to earth ground at only one point, and door means for closing the opening having a magnetic permeability sufficient to so reduce the magnetic fields and radio frequency fields.

2. The scan room of claim 1 in which the scan room is cylindrical in cross-section and positioned with its longitudinal axis parallel to the longitudinal axis of the magnet of the imager.

3. The scan room of claim 1 in which the thickness of the plates vary in accordance with the strength of the magnetic field at the location of the plates with no steel present.

4. The scan room of claim 3 in which the plates include at least two layers of plates.

5. The scan room of claim 4 in which one layer is made of a steel having a different magnetic permeability.

6. A scan room that is large enough to completely enclose a full body magnetic resonance (MR) imager and that will reduce to an acceptable level outside the room the strength of the fringe magnetic fields produced by the imager and shield the imager from magnetic and radio frequency field produced outside the room while allowing the magnet of the imager to be shimmed to produce a field sufficiently homogeneous to obtain the desired images, said scan room comprising side walls of welded steel plates of a steel symmetrically encircling the MR device and spaced therefrom, a floor of welded steel plates extending between the side walls below the imager, and a ceiling of welded steel plates extending between the side walls above the imager, said plates being made of a steel having sufficient thickness to reduce the fringe magnetic field outside the housing to below five gauss, means for electrically insulating the plates from earth ground except at one point, an opening in the side walls providing ingress and egress to the room and the imager, and door means for closing the opening to maintain the magnetic and radio fields outside the housing below five gauss.

7. The scan room of claim 6 in which the side walls and ceiling are made up of layers of steel plate to obtain the desired thickness.

8. The scan room of claim 6 in which the door includes a door frame and metal plates attached to the frame on both side.

9. The scan room of claim 8 in which the metal plates include an inner plate of steel, an outer plate of stainless steel, and a middle plate of copper.

10. The scan room of claim 6 further provided with utility ducts constructed of electrically conductive material that extend through the walls of the housing that have a length to diameter ratio designed to achieve more than 80 dB reduction at 1MHz.

11. The scan room of claim 6 or 7, in which the ceiling is curved away from the MR device in a direction that is perpendicular to the magnetic axis of the magnet of the device to produce a substantially uniform effect on the magnetic field.

12. The scan room of claim 1 or 6 in which the means for electrically insulating the room from ground comprises a relatively thin layer of water impervious material that has high electrical resistance, such as polyethylene, and a relatively thick layer of material having high electrical resistance to further space the metal in the floor from ground.

13. The scan room of claims 1 or 6 in which the plates are made of cold-rolled steel.

14. The scan room of claims 1 or 6 in which the walls of the scan room comprise a plurality of layers of steel plates welded together.

15. The scan room of claims 1 or 6 in which the walls of the scan room comprise a generally uniform thickness of cold-rolled steel with a low magnetic permeability and high saturation strength on the inside and a plurality of layers of steel having a high magnetic permeability and low saturation strength on the outside at the areas of the wall where the strength of the fringe magnetic fields produced by the imager is above the desired minimum outside the wall.

16. The scan room of claims 1 or 6 in which the walls of the scan room comprise a plurality of spaced layers of cold-rolled steel.

17. The scan room of claims 1 or 6 in which the walls of the scan room comprise a plurality of spaced layers of cold-rolled steel and a spaced layer of a steel having a high magnetic permeability on the outside at the areas of the wall when the strength of the fringe magnetic fields produced by the imager is above the desired minimum outside the wall.

* * * * *